United States Patent [19]

Tonnel et al.

[11] Patent Number: 4,890,142
[45] Date of Patent: Dec. 26, 1989

[54] POWER MOS TRANSISTOR STRUCTURE

[75] Inventors: Eugène Tonnel, Meylan; Gilles Thomas, Fontanil Cornillon, both of France

[73] Assignee: SGS-Thomson Microelectronics S.A., Gentilly, France

[21] Appl. No.: 208,224

[22] Filed: Jun. 17, 1988

[30] Foreign Application Priority Data

Jun. 22, 1987 [FR] France ............................ 87 09157

[51] Int. Cl.⁴ .......................................... H01L 29/78
[52] U.S. Cl. ................................. 357/23.4; 357/42; 357/71
[58] Field of Search ................. 357/23.4, 71, 59 I, 357/23.8, 42

[56] References Cited

U.S. PATENT DOCUMENTS

| 4,589,004 | 5/1986 | Yasuda et al. | 357/23.4 |
| 4,612,565 | 9/1986 | Shimizu et al. | 357/59 I |
| 4,631,705 | 12/1986 | Honda | 365/182 |

FOREIGN PATENT DOCUMENTS 0091079 10/1983 European Pat. Off. .
2098799 11/1982 United Kingdom .

Primary Examiner—Andrew J. James
Assistant Examiner—Mark Prenty
Attorney, Agent, or Firm—Lowe, Price, LeBlanc, Becker & Shur

[57] ABSTRACT

The invention relates to a structure of parallel power MOS transistors, each of which comprises on a common face of a substrate gate, source and drain contact zones and three levels of the connection layers. The first level of connection layers (20) establishes a contact with all the gates and a connection between each gate and the adjacent gates. A second level of the connection layers establishes a contact with all the source regions (22) and drain regions (23) and a connection between each source (or drain) region and the adjacent source (or drain) regions, and has apertures insulating each drain (or source) contact. A third continuous level of the connection layer level (25) establishes a contact with all the drain (or source) regions of the second level of the connection layers.

5 Claims, 5 Drawing Sheets

POWER MOS TRANSISTOR STRUCTURE

BACKGROUND OF THE INVENTION

The invention relates to power MOS transistors and, in particular, to complementary field effect MOS transistors (CMOS) and the manufacturing method thereof.

TECHNICAL FIELD OF THE INVENTION

This invention relates particularly to a structure to which relatively high voltages, in the range of some hundreds volts, can be applied.

Interface integrated circuits associate more and more frequently, in a monolithic structure, CMOS-type insulated power components and logic circuits also of the CMOS type.

Various MOS transistor structures to which high voltage can be applied are known. In case of power MOS implementation, in order that significant currents can flow through those structures, one uses a great number of parallel connected elementary transistors also sometimes known as transistor cells for example between $10^4$ and $10^6$).

Thus, in an integrated circuit, one wishes for example to implement in a first part of the surface a logic circuit, in a second part a power MOS transistor of a first conductivity type, for example N-channel, and in a third part a power MOS transistor of a second type, that is P-channel, the two power transistors being made of a great number of identical transistor cells connected in parallel.

For connecting transistor cells in parallel, the gates, sources and drains are respectively to be interconnected, those various regions being on a same surface of a semi-conductor wafer.

As the largest part of the manufacturing techniques of integrated circuits use only two connection layers, topologic and size problems arise in interconnecting all the gates, all the sources and all the drains without short-circuit. Thus, in the prior art, structures are used, some of the connections, for example the drains, are connected according to sub-groups through high doping level regions provided within the semiconductor substrate (often buried layers). However, such connections are unavoidably more resistive than the connection layers carried out atop the semi-conductor substrate, for example comprising doped polysilicon, silicice, or metallization. Correlatively, interdigital structures have been used, i.e. structures wherein fingers or comb teeth shaped electrodes of source and drain, respectively, are intermixed for contacting the respective source and drain areas. Here also, the necessity of providing fingers having large lengths causes relatively important access resistances.

Such important access resistances towards the gate, the source or the drain impair the rapidity of operation of the device and necessitate large size connections for avoiding heating.

An example of prior art structure is disclosed in connection with FIGS. 1A–1D, wherein FIGS. 1A and 1B show a front view of an electrode structure used in case two metallization levels are available for insuring the gate, source and drain connections, with FIGS. 1C and 1D showing corresponding cross-section views.

Referring first to the cross-section view of FIG. 1C, DMOS (diffused MOS) N-channel transistors comprise source regions 1, layers 2 wherein the channel regions have to be formed, and drain regions 3. This structure is formed in an N-type epitaxial layer 4 under which is an N+-type buried layer 5 formed on a P-type substrate 6. The conduction occurs when a bias voltage is applied to the gate electrode 7 formed on a gate oxide layer 8, from the source regions 1 through the channel regions towards the N+-type buried layer 5 and up to the drain regions 3. Possibly, deep N+-type diffusions 9 improve the conduction between the drain regions 3 and the buried layer 5.

This structure is shown only as an example of a great number of usable power MOS transistor structures.

Considering more specifically the implementation of the electrodes, in a first connection level, a gate electrode 7 shown in FIG. 1A is formed. Then, on this conductive layer an insulating layer is deposited, for example an SiO$_2$ layer that is opened at the positions shown in FIG. 1A according to squares on the source regions inside the lattice of the gate electrode, to elongated fingers 11 on the drain regions and to localized apertures 7-1 at the periphery of the gate electrode 7. Then, as shown in FIG. 1B, a second interconnection level is deposited and etched for providing drain metallization 12 having the shape of an elongated finger, a source metallization 13 establishing a contact with all the upper surfaces of the sources inside the apertures in the first level gate electrode, and a gate connection metallization 14. FIG. 1D shows a cross-section view of FIG. 1B, wherein one can see the two interconnection levels and wherein the same layers as in the other figures are designated by identical reference numbers.

It can be seen that those structures cause an assymmetry between the source and drain electrodes. The conduction towards the drains is carried out through the buried layer 5 and the drain electrode 12 is digited. One usually tries to compensate the conduction by adjusting the width of the drain connection but however one obtains assymmetric structures for the drain and the source. This is not favorable to the flowing of significant currents which is one of the main objects when one wishes to carry out power transistors.

Additionally, if one wishes to carry out structures comprising, as indicated in the above, a large number of parallel transistor cells, for example between $10^4$ and $10^6$, for avoid having too long drain fingers, a plurality of structures as shown in FIGS. 1A and 1B are parallel connected by providing an important digitation of the electrodes.

With the progress of the manufacturing techniques of integrated circuits, it is now possible to implement structures with three metallization levels. However, perhaps from sheer force of habit, the digited prior art structure is still used and one can still see parallel MOS transistor structures wherein the sources are grouped according to sub-sets and important digitations are used on the drains. The third interconnection layer is used for increasing the thickness of some metallization levels or for recontacting cross-contacts on the source and drain fingers and accordingly improving the lattice structure of the electrode array for reducing the access resistance.

SUMMARY OF THE INVENTION

Accordingly, an object of the invention is to provide for a new three-level interconnection structure for parallel power MOS transistors enabling reduction in the access resistance towards the gates, sources and drains, and to obtain a symmetrical source/drain structure.

Another object of the invention is to provide for a new power MOS transistor structure specifically adapted to the connection mode carried out according to the first object of the invention.

A further object of the invention is to provide for P- and N-channel MOS transistor structures, respectively, adapted to the connection mode according to the invention and compatible with each other.

For attaining these objects, the instant invention provides for a structure of parallel power MOS transistors, each of which comprises on a common face of a substrate gate, source and drain contact zones and three levels of connection layers, a first level of the connection layers establishing a contact with all the gates and a connection between each gate and the adjacent gate, this first level connection layer comprising openings above the source and drain contact regions the structure, further comprising: a first insulation layer opened over the source and drain contact regions, a second level of the connection layers establishing a contact with all the source regions and drain regions and a connection between each source (or drain) region and the adjacent source (or drain) regions, apertures insulating each drain (or source) contact, a second insulation layer opened over the drain (or source) regions, a third continuous level of the connection layers establishing a contact with all the drain (or source) regions of the second connection layer level.

According to an embodiment of the instant invention, the first level of the connection layers comprises polysilicon and a silicide and the second and third levels of the connection layers comprise metallizations.

According to another aspect of the invention, a structure is provided for complementary MOS (CMOS) power transistors each of which is constituted of a transistor structure generally as indicated in the above description and wherein, on the first type of MOS, the second connection layer is associated with the sources and wherein, on the second type MOS, the second connection layer is associated with the drains.

A complementary field effect transistor structure particularly suitable for the instant invention comprises a DMOS type lateral N-channel transistor and an extended drain type lateral P-channel transistor, wherein, in an N-DMOS, the channel region is separated from the drain region by a field oxide layer and wherein, in an P-MOS, the drain extension is formed under a field oxide region.

According to an embodiment of the invention, the doping level of the drain extension region of the P-MOS results from an implantation carried out in a self-aligned way before the growing of the field oxide.

Those and other objects, features and advantages of the instant invention will be explained in greater detail in the following description of a preferred embodiment, in connection with the attached drawings wherein:

DESCRIPTION OF THE PREFERRED EMBODIMENTS

Generally, and as it is conventional in the representation of integrated circuits, it will be appreciated that the various drawings are not drawn to scale from one figure to another nor inside a given figure, and in particular that the layer thicknesses are arbitrarily drawn for facilitating the reading of the drawings.

Figure 1A:
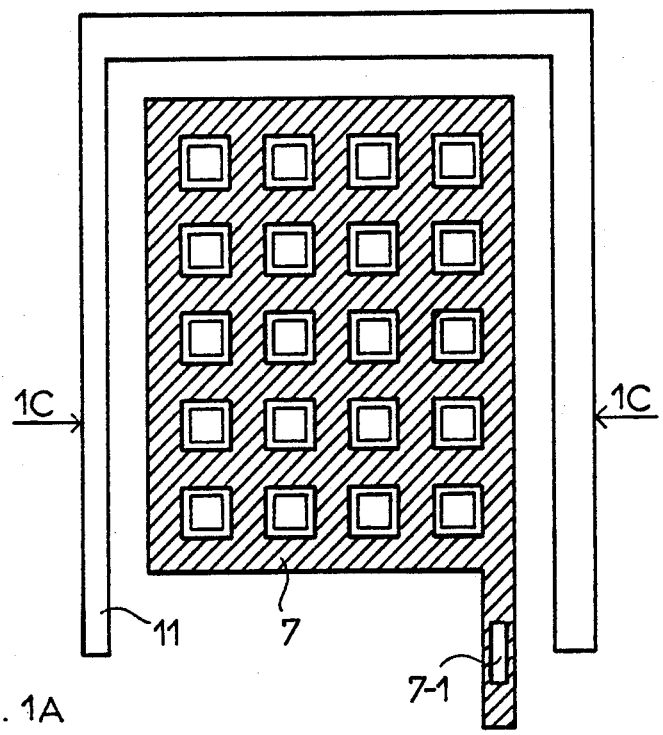
FIGS. 1A to 1D, illustrate an example of the state of the art.
Figure 1C:
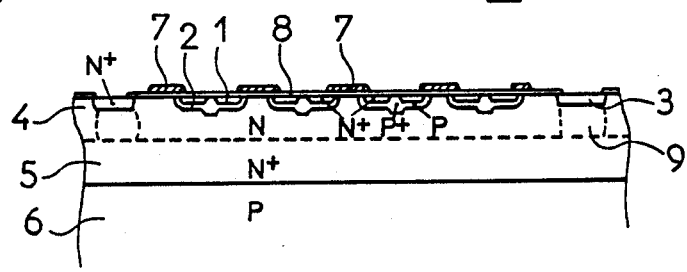
Figure 1B:
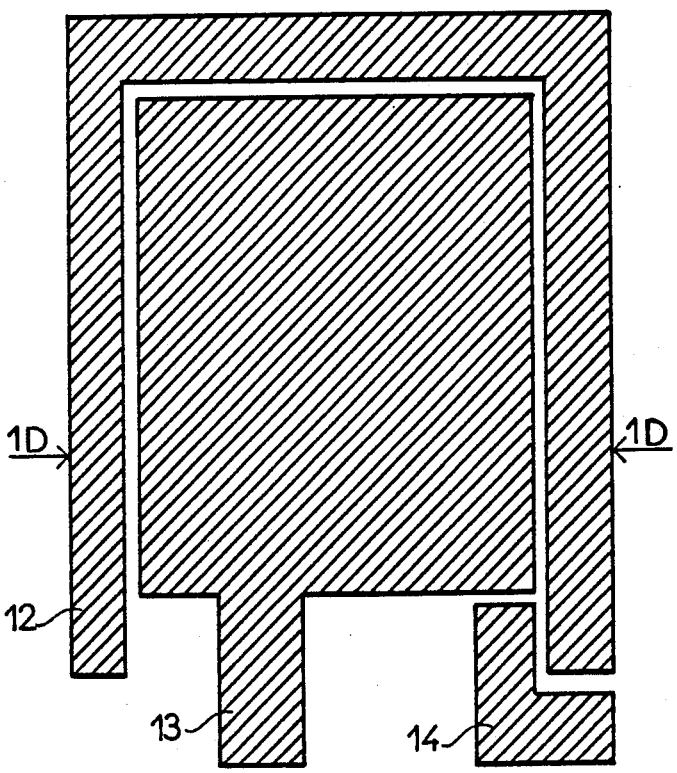
Figure 1D:
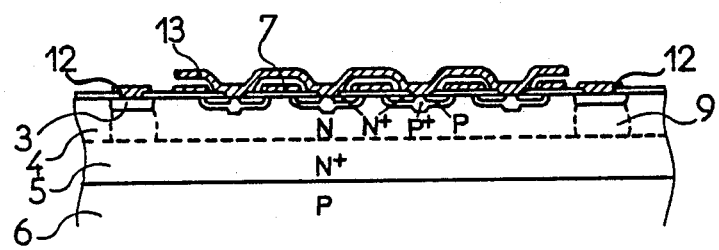
Figure 2C:
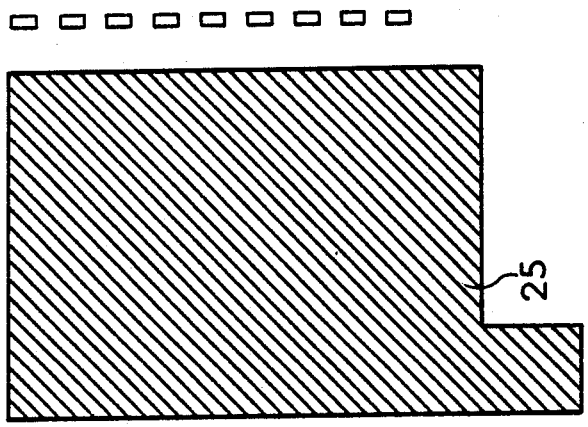
FIGS. 2A, 2B and 2C illustrate upper views of first, second and third interconnection levels according to a preferred embodiment of the present invention.

The upper views of FIGS. 2A, 2B, 2C will be better disclosed in the following while reading examples of MOS transistors according to the invention. However, it will be sufficient to conceive that one has formed in a semiconductive substrate a number of parallel MOS transistors i.e., transistor cells as mentioned earlier, each of which comprises, side by side, a drain zone and a source zone having substantially the same surface and separated by a gate region. Accordingly, in a top view, the drain and source regions alternate, as do the black and white cases of a chessboard, the gate regions corresponding to the borders between those cases of the chessboard but obviously having a non-zero width.

Figure 2B:
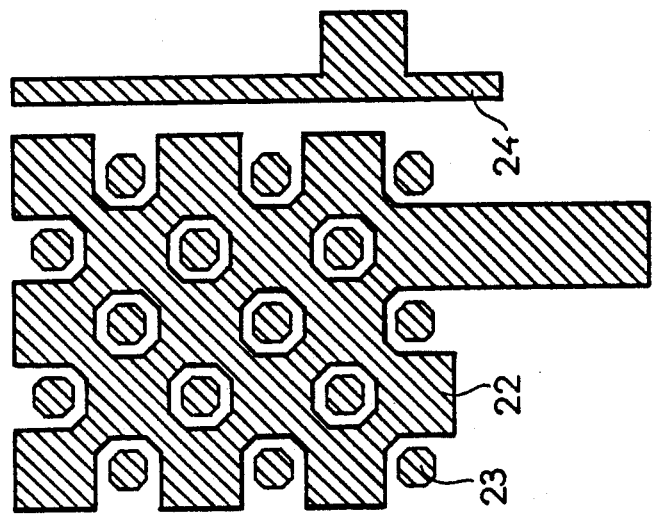
Figure 2A:
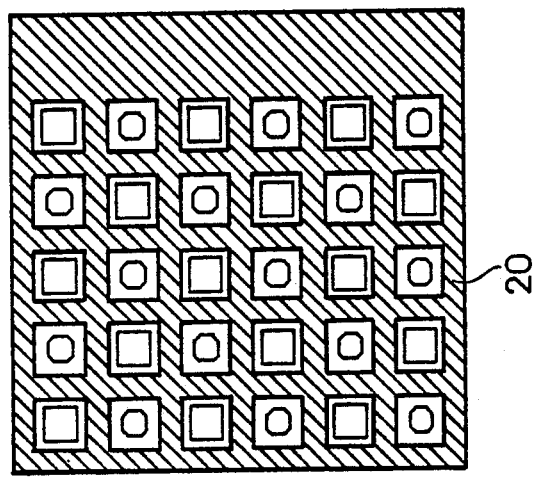

FIG. 2A shows a first metallization level 20 wherein only the gate electrode has been carried out for establishing a structure having only the shape of a chessboard. Openings are made in the gate electrode, those openings permitting one to see alternately a drain region and a source region. This first metallization level 20 is then covered with an insulation layer which is in turn opened inside the cases surrounded by the gate regions. Although the word "metallization" has been used in the above, this first connection level can be a polysilicon layer, possibly covered with a metal silicide layer or partially or fully transformed into a metal silicide or also be a refractory metal.

FIG. 2B shows a second metallization level which contacts the open surfaces of the source and drain areas. Then, this metallization layer is etched as shown in the figure for letting in place:

a source metallization 22 contacting all the uncovered source areas and providing a connection with each adjacent source metallization;

drain metallizations 23 contacting each uncovered drain surface but insulated from the source metallization and from each other;

a metallization 24 contacting the first level gate metallization shown in FIG. 2A and formerly uncovered at a selected place.

Then, an insulation layer is uniformly deposited onto the wafer surface, as shown in FIG. 2B. Openings are formed at each of the drain metallizations 23 and at the output connections of the gate and source electrodes; and a third uniform metallization level 25, as shown in FIG. 2C, is deposited for interconnecting all the drains and for providing the output from the gate and source electrodes.

As it will be appreciated, in the above structure, the terms drain and source can be exchanged without modifying the structure itself.

Figure 3:
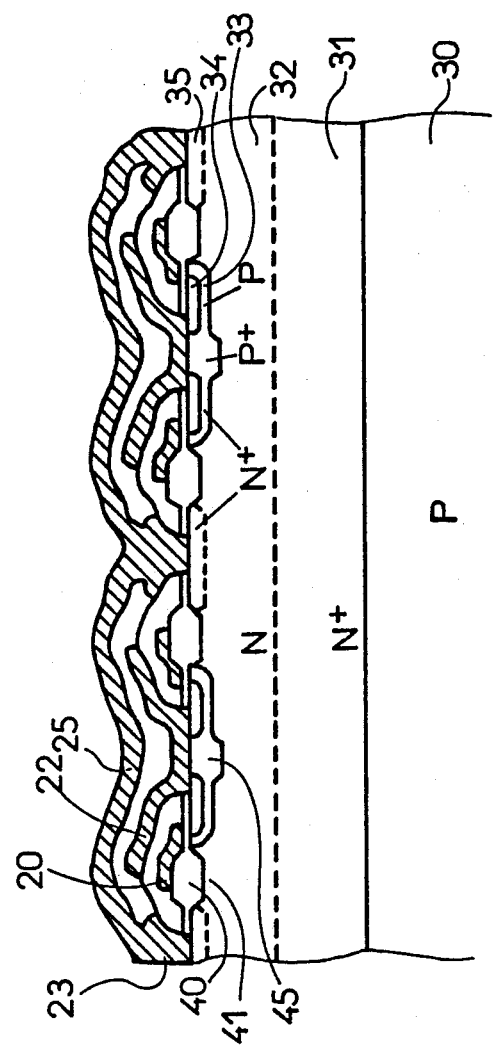
FIG. 3 shows a cross-section view of an N-channel DMOS transistor structure particularly suitable for the instant invention.

FIG. 3 is a cross-section view of a portion of a set of parallel N-type MOS transistors, particularly suitable for being used according to the invention. The metallizations are designated by the same references as in FIG. 2.

This structure comprises a P-type substrate 30, an N+-type buried layer 31 common to all the parallel N-type MOS transistor structures but insulated with respect to the corresponding buried layer of the other MOS transistors existing on the same wafer, and an epitaxial N-type layer 32. The MOS transistors comprise channel regions 33, source regions 34 and drain regions 35. The channel region 33 and the source region 34 being two regions successively diffused into epitaxial layer 32, this structure is commonly called diffused channel MOS or DMOS.

The specific structure of FIG. 3 presents, with respect to a conventional power DMOS structure, the following specific features:

Field oxide regions 40 separate the channel region itself under the gates 20 from the drain regions per se, 35, that is the drain comprises, on the one hand, the highly doped region 35 and, on the other hand, a region 41 arranged under said field oxide layers, having the same N-conductivity type but a lower doping concentration. Region 41 may originate from an implantation carried out before growing the field oxide region 40 and can therefore be self-aligned with said field oxide regions by using the same mask as the one which will be used for delimitating the field oxide regions.

Region 33, commonly called a channel region because a channel is formed in a surface portion of this region under gate 20, presents a specific structure. On the one hand, it comprises a P diffusion zone determined by the edge of the openings etched in the gate electrode 20, on the other hand, centrally, a P+-type region 45 is provided and extends upwards up to the substrate surface so the source electrode 22 contacts on the one hand the source region 34, on the other hand, this P+-type region 45. Accordingly, a source-channel shorting is obtained.

Figure 4:
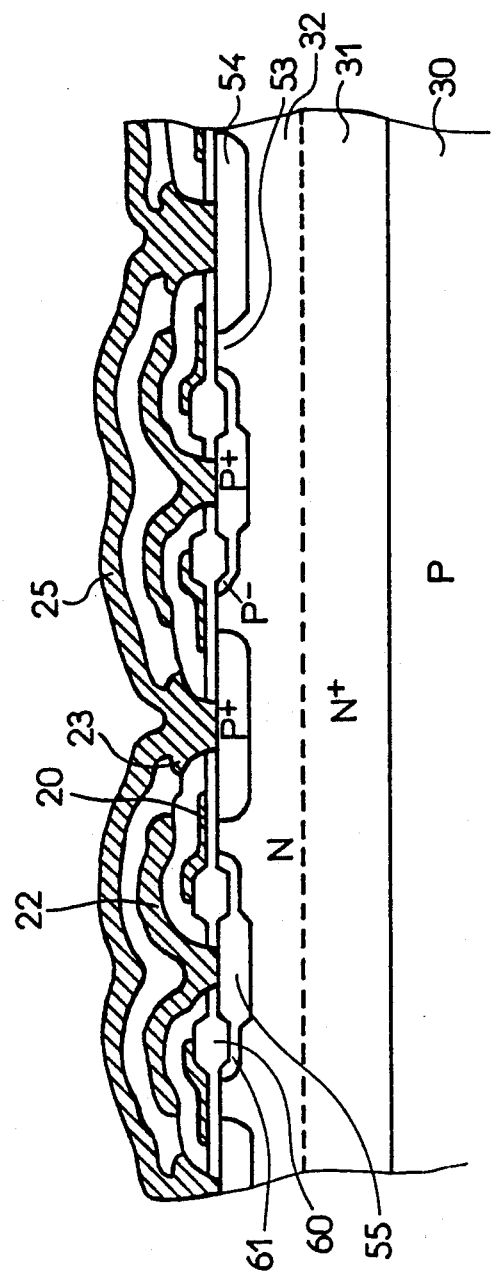
FIG. 4 shows an extended drain P-channel MOS transistor structure particularly adapted to the instant invention and compatible with the N-channel transistor structure shown in FIG. 3 for forming therewith complementary MOS transistors.

FIG. 4 shows a cross-section view of a portion of a P-channel MOS transistor set particularly adapted to the electrode arrangement according to the invention and additionally compatible as regards its manufacturing with the above disclosed N-channel DMOS transistor structure.

One can see again in FIG. 4 the P-type substrate 30, the N+-type buried layer 31 common to all the parallel PMOS transistors and the N-type epitaxial layer 32. In this epitaxial layer, each transistor comprises channel (53), source (54) and drain (55) regions.

This transistor is of the composite channel type, sometimes also called extended drain type. It presents the following particularities:

The P+ drain region 55 is surrounded by a field oxide lattice 60 under which extend extensions 61 of the drain region, also P-type but with a lower concentration than the P+-type drain zone itself. These drain extensions are designated by reference 61.

As in case of the structure of FIG. 3, it will be noted that the drain extension zones 61 under the field oxide zones 60 can be self-aligned with the field oxide lattice 60 by providing an implantation determined by the same mask as the one serving to delimit the field oxide regions.

In FIG. 4, the various metallization levels are designated by reference numerals identical to those of FIGS. 2 and 3. It will however be noted that the second metallization level 22, 23, which, in FIG. 3, corresponds to the source metallizations and the drain contacts, respectively, corresponds in FIG. 4 to the drain metallizations and to the source contacts. Also, the third metallization level 25 which, in FIG. 3, is a drain metallization, corresponds, in FIG. 4, to a source metallization. This inversion is not accidental but is particularly interesting in case of extended-drain MOS transistors for obtaining a stability and a minimum field at the surface of the transistor. Indeed, the simultaneous effect of the potentials applied to the surface of the semiconductive wafer by the source and drain metallizations permits one to obtain a flattening of the field lines by formation of a field shield above the drain limit regions, and accordingly permits an higher voltage withstand.

The advantages of the specific structures of an N-channel DMOS transistor and a P-channel extended drain DMOS transistor as disclosed in FIGS. 3 and 4 will appear more clearly at the reading of the following description of a simultaneous manufacturing method of those transistors, wherefrom it appears that those two transistors can be manufactured simultaneously by using a minimum of manufacturing steps, the greatest part of those steps being common to the formation of an element in each structure.

The main steps are the following ones:

1. Formation of N+-type buried layers 31 by implantation and diffusion of arsenic (As—$4 \times 10^{15}$ Acm$^{-2}$, 100 KeV) in a P-type substrate 30 having a resistivity of 14 to 20 ohms.cm and an orientation (100).
2. Formation of insulation foundations—a boron implantation with a dose of $4 \times 10^{14}$ Acm$^{-2}$ with an energy of 180 KeV can be used. Those P+-type insulation foundations (not shown) are provided for, in connection with going-down P diffusions, insulating the wells wherein logic MOS structures can be formed later on.
3. Epitaxial deposition of N-type silicon layer 32; the features of this layer are chosen as a function of the voltage capability desired for the power MOS transistors. Variable thicknesses comprised between 10 and 30 micrometers and resistivities comprised between 1 and 15 ohms/cm can be used for obtaining components, the operating voltage of which will vary between 60 and 500 volts.
4. Formation of the deep N+ drains of the N-type MOS and P-type diffusions joining the foundations mentioned in point 2. The drains are formed by diffusion from a phosphorous source and the P-type regions by boron implantation ($10^{13}$ Acm$^{-2}$), the diffusion treatment being made simultaneously at an high temperature (for example 1,220° C. during a period of 4 to 6 hours).
5. The P-wells being so formed, the manufacturing of the active elements can be done.

The manufacturing of the MOS transistors is of the type using a nitride localized field oxidation, and a self-aligned field implantation, the field implantations being carried out with boron at $10^{13}$ Acm$^{-2}$ for the P-fields and with arsenic at $5 \times 10^{12}$ Acm$^{-2}$ for N-fields. Those implantations are carried out in regions that will be lately oxidized in order to form thick thermal oxide layers SiO$_2$ (about 1 micrometer), regions that are not covered by the nitride.

Those implantation regions will form either field regions of a logic CMOS portion, either the composite channels, or the drain extensions (61) of the MOS transistors as the one shown in FIG. 4. This use for various purposes of the field implantations constitutes one aspect of the instant invention.

6. The nitride protecting the active regions is then taken off, the gate oxidation is carried out on a thickness of 50 to 100 nm, and the polysilicon layer 20 is deposited and doped in order to form the first connection level.
7. The gate electrodes of the various types of MOS transistors are then simultaneously etched. Successive selections permit to implant: channel 33 of the DMOS with boron ($2$–$5 \times 10^{13}$ Acm$^{-2}$); the P+-regions corresponding to the drains 55 and the sources 54 of the P-MOS and to short-circuits 45 of the DMOS with boron ($5$–$8 \times 10^{14}$ Acm$^{-2}$); and finally N+-regions forming the drains and sources of the DMOS (in this purpose, an arsenic dose of 5 to $7 \times 10^{15}$ Acm$^{-2}$ can be used). Those various implantations are followed with suitable thermal treatments in order to restore the defects and obtain optimal junction depths. Typical depths of 1 to 1.5 micrometers for the N+ and P+ regions permit to obtain satisfactory power transistors.

The active regions being doped after etching of the gate electrodes in the polysilicon layer, it is possible to align the various regions on the edges of said electrodes. In particular, it is possible to reduce the size of the elementary cell of the DMOS, by aligning the P+ region forming the source shorting on the edge of the gate electrode (FIG. 3).

In the same way, the alignment of the drain extension under the thick oxide permits one to avoid position mismatches and to reduce the size of the drain extension at the necessary value for safely withstanding the necessary voltage.

Thus, in both cases, a substantial reduction of the necessary surface will be obtained and, therefore, a better use of the silicon.

8. As regards the metallizations of the second and third connection levels, they can be carried out by the following successive steps:
   depositing an insulation layer on the gate electrode 20;
   etching openings in this layer for baring the silicon;
   depositing a metal layer and etching the interconnections for obtaining, for example in case of the N-channel power DMOS, a source electrode 22 shaped as an array and insulated pads 23 on the drains of each elementary MOS;
   depositing an insulation layer and opening through crossings at the pads 23 formerly reserved on each drain. This operation may require a plurality of successive depositing and plasma etching steps, in order to obtain a sufficiently plane insulation layer for permitting an insulation and a correct disposition of the second metal layer;
   depositing the second metal layer and etching the drain electrodes 25.

In a preferred embodiment, the metal electrodes are etched in aluminum layers doped with silicon and copper and the dielectric layers are obtained by chemical vapor deposition of phosphorous doped SiO$_2$. Composite layers of TiW-Al with silicide type contacts (Pt-Si) have also been successfully used.

The integrated power MOS structure according to the invention presents the following characteristics:
1. Multilayer structure of the type lattice array interconnecting the gates, drains and sources of the transistor cells constituting the elementary MOS.
2. Planar electrode structure permitting to cover the whole active surface of the power transistor.
3. Utilization of the same step (field implantation) for controlling the parasitic so-called field MOS transistors and the regions so-called of extended drain of the power high voltage MOS transistors.
4. Order of the successive doping steps.

The advantages of the structure and of the process carried out, accordingly include the following:
1. Minimum resistance between any two elementary transistor cells of the power high voltage MOS transistors;
2. Maximum ability to withstand voltage, and stability of the high voltage MOS transistors;
3. Structure having a maximum density due to the self-alignment method resulting from the order chosen for the successive doping steps.

Considering again the various connection levels, the main characteristics of the electrodes are the following ones:
   they form, in three distinct planes, a lattice array of interconnection of the gate, source and drain regions of the various elementary cells;
   each interconnection plane is insulated from the following one by a dielectric layer, the thickness of which can be adjusted as a function of the wished characteristics.

This pattern provides to the set of elementary transistor cells the following interesting electric properties:
   obtaining a minimum resistance between the equivalent electrodes (gate, drain or source) of two elementary transistor cells whatever be their arrangement in the set constituting the power transistor;
   covering the whole surface of the device by the set of electrodes: this arrangement permits to have the drain and source electrodes acting as an electrostatic shield. It is particularly interesting in case of extented drain MOS transistors for providing stability and the minimum field at the surface of transistor; for obtaining the optimum shield effect, in the case shown in FIG. 2, the order in which the source and drain interconnections are carried out is inverted: the source electrodes will be connected at the level 2 and the drain electrodes at the level 3 in case of an N-channel DMOS, while the inverse order will be chosen in case of the P-channel MOS, the drain being connected with the level 2 and the source with the level 3. In both cases, the polysilicon gate electrode is carried out first and constitutes the level 1; it can be connected either with level 2 or level 3, the pads necessary for the output connection of the casing being always formed in the last metallization layer.
   this particular arrangement of multi-layer electrodes permits one, by adjusting the thicknesses of the dielectrics that insulate said electrodes from each other, to obtain a progressive effect of field shield and a maximum voltage withstand of the two types of MOS transistors.

Still other objects and advantages of the present invention will become readily apparent to those skilled in this art from the preceding detailed description, wherein only the preferred embodiments of the invention are illustrated and described, as aforementioned, simply by way of presenting the best modes contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive, the invention being defined solely by the claims appended hereto.

We claim:

1. A structure of a power MOS transistor comprising a plurality of transistor cells connected in parallel, each of which comprises on a common face of a substrate gate, source and drain contact zones and three levels of connection layers, a first level of said connection layers establishing a contact with all the gates and a connection between each gate and the adjacent gates, this first level of said connection layers comprising openings above the source and drain contact regions, further comprising:

a first insulation layer opened over the source and drain contact regions;
   a second level of said connection layers, establishing a contact with all the source regions and drain regions and a connection between each source (or drain) region and the adjacent source (or drain) regions, with apertures insulating each drain (or source) contact;
   a second insulation layer opened over the drain (or source) region; and
   a third continuous level of said connection layers, establishing a contact with all the drain (or source) regions of the second level of said connection layers.

2. A MOS power transistor structure according to claim 1, wherein:

the first level of said connection layers comprises polysilicon and a silicide, and the second and third levels of said connection layers comprise metallizations.

3. A complementary MOS (CMOS) power transistor structure according to claim 6, further comprising:

in a monolithic integrated circuit, an N-DMOS type lateral N-channel transistor and an extended drain type P-MOS lateral P-channel transistor, wherein, in said N-DMOS the channel region thereof is separated from the drain region thereof by a field oxide layer and in the P-MOS said drain extension is formed under a field oxide region.

4. A complementary MOS (CMOS) transistor structure according to claim 4, wherein:

doping of said drain extension region of said P-MOS is provided by an implementation carried out in a self-aligned way before growing of said field oxide, layer thereof.

5. A complementary MOS (CMOS) power transistor structure in a monolithic integrated circuit, comprising a plurality of MOS power transistors of a first type and a second type, each of said power transistors of either type comprising a plurality of transistor cells each of which comprises on a common face of a substrate gate, source and drain contact zones and three levels of connection layers, a first level of said connection layers establishing a contact with all the gates and a connection between each gate and the adjacent gates, this first level of said connection layers comprising openings above the source and drain contact regions, further comprising:

a first insulation layer opened over the source and drain contact regions;
   a second level of said connection layers, provided such that in a power transistor of said first type said second connection layer is associated with said sources of said transistor cells thereof to provide a connection between each source region and other source regions adjacent thereto, and a MOS power transistor of said second type said second connection layer thereof is associated with said drains thereof to provide a connection between each drain region and adjacent drain regions, said second level of said connection layers each being formed with apertures insulating each respective drain or source contact;
   a second insulation layer opened over said drain (or source) regions; and
   a third level of said continuous connection layers for establishing a contact with all of said drain (or source) regions of said second level of said second level of connection layers.

* * * * *